United States Patent
Yoon et al.

(10) Patent No.: US 7,202,542 B2
(45) Date of Patent: Apr. 10, 2007

(54) SEMICONDUCTOR STRUCTURE WITH METAL MIGRATION SEMICONDUCTOR BARRIER LAYERS AND METHOD OF FORMING THE SAME

(75) Inventors: Hojun Yoon, Stevenson Ranch, CA (US); Richard King, Thousand Oaks, CA (US); Jerry R. Kukulka, Santa Clarita, CA (US); James H. Ermer, Burbank, CA (US); Maggy L. Lau, Hacienda Heights, CA (US)

(73) Assignee: The Boeing Company, Chicago, IL (US)

( * ) Notice: Subject to any disclaimer, the term of this patent is extended or adjusted under 35 U.S.C. 154(b) by 231 days.

(21) Appl. No.: 10/739,755

(22) Filed: Dec. 17, 2003

(65) Prior Publication Data

US 2005/0133919 A1    Jun. 23, 2005

(51) Int. Cl.
*H01L 27/14* (2006.01)
(52) U.S. Cl. .................. 257/428; 257/434; 257/751
(58) Field of Classification Search ................ 257/431, 257/428, 434, 751
See application file for complete search history.

(56) References Cited

U.S. PATENT DOCUMENTS 5,822,348 A * 10/1998 Fujii ...................... 372/45.01
6,346,431 B1 * 2/2002 Yoo et al. ................... 438/94
2002/0050644 A1 * 5/2002 Matsumoto et al. ........ 257/751
2002/0053676 A1 * 5/2002 Kozaki ......................... 257/88

FOREIGN PATENT DOCUMENTS

WO     WO 87/03742    *    6/1987

* cited by examiner

Primary Examiner—Douglas W. Owens
(74) Attorney, Agent, or Firm—Ingrassia Fisher & Lorenz, P.C.

(57) ABSTRACT

A semiconductor structure includes a semiconductor substrate, a semiconductor active region, a semiconductor contact layer, at least one metal migration semiconductor barrier layer, and a metal contact. The metal migration semiconductor barrier layer may be embedded within the semiconductor contact layer. Furthermore, the metal migration semiconductor barrier layer may be located underneath or above and in intimate contact with the semiconductor contact layer. The metal migration semiconductor barrier layer and the semiconductor contact layer form a contact structure that prevents metals from migrating from the metal contact into the semiconductor active layer during long-term exposure to high temperatures. By providing a robust contact structure that may be used in semiconductor structures, for example in solar cells that power spacecraft or terrestrial solar cells used under concentrated sunlight, the high temperature reliability of the semiconductor structure will be improved and the operation time will be prolonged.

26 Claims, 5 Drawing Sheets

US 7,202,542 B2

SEMICONDUCTOR STRUCTURE WITH METAL MIGRATION SEMICONDUCTOR BARRIER LAYERS AND METHOD OF FORMING THE SAME

BACKGROUND OF THE INVENTION

The present invention generally relates to semiconductor structures and, more particularly, to semiconductor structures including metal migration barrier layers preventing metal migration from a contact layer into an active layer of a semiconductor structure and method of forming the same.

While manufacturing semiconductor devices, such as III–V semiconductor based multifunction solar cells, electrical contacts are formed on individual semiconductor devices and connected together to perform the desired circuit functions. The electrical contact formation and connection process involves metal layers and is generally called "metallization". Metal contact layers containing multiple thin layers with alternating composition of, for example Ti/Au/Ag, are conventionally used for providing electrical contact to semiconductor devices.

FIG. 1 provides a schematic cross sectional view of a typical prior art semiconductor structure 10. The semiconductor layers may be deposited during a process typically referred to as semiconductor wafer growth process. In this wafer growth process, semiconductor active layers 11 are generally deposited onto a semiconductor substrate 12. A semiconductor contact layer 13 may be then deposited onto the semiconductor active layers 11. Typically, the semiconductor contact layer 13 is the last layer to be deposited during the wafer growth process. After completion of the growth process, a metal contact 14 is generally deposited in a separate process typically referred to as device fabrication process.

Metal films used for electrical contacts on semiconductor devices may migrate into the semiconductor active region under certain environmental conditions, such as long time exposure to high temperatures, causing product reliability concerns. FIG. 2 shows a schematic cross sectional view of a typical prior art semiconductor structure 10 wherein metal protrusion 15 from the metal contact 14 into the semiconductor active layers 11 has occurred. The metal protrusion 15 may cause the semiconductor structure 10 to fail. Consequently, a semiconductor structure that blocks or prevents metal migration from the metal contact into the semiconductor active layer is highly desirable and is important for the operation life, and high temperature reliability of such semiconductor structure 10, for example, a solar cell.

The most common method to mitigate the existing problem is to use a metal barrier layer as part of the entire metal contact structure, such that the barrier metal is placed underneath the main metal layer 14. In prior art, platinum (Pt), palladium (Pd), and similar elements or compounds that have high temperature stability are commonly used as metal barrier layers. The main purpose of the metal barrier layer is to prevent diffusion of conductive material from the metal contact 14, such as Au or Ag, for example, into the semiconductor active layers 11.

However, this prior art approach may still be susceptible to metal diffusion under certain environmental conditions, such as exposure of the semiconductor structure to high temperatures for prolonged periods of time. Since the semiconductor contact layer 13 generally is composed of a single homogeneous structure, the semiconductor contact layer 13 may not provide any obstacles to the metal protrusion 15 once the metal diffusion process has started. Therefore, once metal migration from the metal contact 14 into the semiconductor contact layer 13 has started, it is likely that the metal will migrate through the entire semiconductor contact layer 13 and reach the active semiconductor region. Consequently, it will be only a matter of time until the metal reaches the semiconductor active layers 11 and causes the structure to fail. Therefore, it is necessary to find appropriate materials that can be incorporated within the contact structure of a semiconductor structure and that enable suppression of the metal migration into the active region of the structure even during long time exposure to high temperatures, as found for example during space and terrestrial applications.

Prior art multijunction solar cells 11 (as shown in FIG. 3) provide power to many satellites and other spacecraft. FIG. 3 shows a perspective view of a cell-interconnect-coverglass assembly 30 of a typical prior art multijunction solar cell 31. A plurality of interconnects 32 may be provided at one edge of the solar cell 31. The interconnects 32 may be welded on top of the metal contact 14, as shown in FIGS. 1 and 2. A coverglass 33 may be installed to protect the solar cell 31 and the interconnects 32 from radiation in space. Presently, metal protrusion 15 from the metal contact 14 through the semiconductor contact layer 13 and into the semiconductor active layers 11, as illustrated in FIG. 2, may be observed more readily in the areas where the interconnects 32 are connected with the solar cell 31. For space applications, such as the operation of III–V based multijunction solar cells mounted on spacecraft, the device operation life under extreme environmental conditions, such as exposure to relatively high temperatures for relatively long times, is of very high importance. Therefore, a prolonged life, a higher performance, an improved high temperature reliability, and stability of the solar cells 31 would result in a prolonged operation of the spacecraft. Furthermore, solar cells 31 with a semiconductor contact structure that blocks or prevents metal protrusion 15 would provide a more stable and improved total power output over the life of a spacecraft due to a lower degradation rate.

There has, therefore, arisen a need to provide a metal migration semiconductor barrier layer that is able to suppress metal migration from the metal contact of a semiconductor device into the semiconductor active region under extreme environmental conditions, such as exposure to high temperatures for long times, as found, for example, for applications in space, as well as on earth, under concentrated sunlight. There has further arisen a need to provide an appropriate material for a metal migration semiconductor barrier layer that is able to block the movement of metal within the semiconductor contact layer and to keep the metal away from the active region of the semiconductor device under extreme environmental conditions, such as found in space. There has also arisen a need to provide an improved solar cell for providing power to a spacecraft, such as a satellite, that will prolong the operation and improve the performance of the spacecraft.

As can be seen, there is a need for a semiconductor structure with a semiconductor contact structure providing improved high temperature reliability. There is a further need for providing a semiconductor structure designed to keep any metal from entering the semiconductor active region such that, consequently, the operation life of the semiconductor structure will be extended. Also, there is a need for preventing metal protrusion from the metal contact into the semiconductor active layers during exposure of the semiconductor structure to high temperatures for long times, improving the performance and stability of the structure.

Furthermore, there is a need for suppression of metal migration into the semiconductor active layers under extreme environmental conditions, such as exposure to high temperatures for long times as found, for example, during space applications. Moreover, there is a need for a method for forming a semiconductor structure for improving the high temperature reliability and the performance time of the semiconductor structure.

SUMMARY OF THE INVENTION

The present invention provides a semiconductor structure that has one or more metal migration semiconductor barrier layers incorporated within or outside of a semiconductor contact layer and, therefore, provides a contact structure with improved high temperature reliability. The present invention further provides a semiconductor structure that is suitable for, but not limited to, use in multifunction solar cells that provide power to spacecraft, for example, satellites. The present invention still further provides an appropriate semiconductor material, such as AlInP, that may be incorporated within the contact structure of a semiconductor structure and that prevents metal protrusion from the metal contact into the semiconductor active layers during long-term exposure of the semiconductor structure to high temperatures, improving the performance, high temperature reliability, and stability of the semiconductor structure. The present invention still further provides a method for forming a semiconductor structure with metal migration semiconductor barrier layers and therefore, for improving the high temperature reliability and the performance time at high temperatures of the semiconductor structure.

In one aspect of the present invention, a semiconductor structure comprises a semiconductor substrate, a semiconductor active region formed on the semiconductor substrate, a semiconductor contact layer grown on top of the semiconductor active region, a metal migration semiconductor barrier layer, and a metal contact deposited on the semiconductor contact. The metal migration semiconductor barrier layer is embedded within the semiconductor contact layer.

In another aspect of the present invention, a semiconductor structure comprises a semiconductor substrate, a semiconductor active region formed on the semiconductor substrate, a metal migration semiconductor barrier layer grown on top of the semiconductor active region, a semiconductor contact layer grown on top of the metal migration semiconductor barrier layer, and a metal contact deposited on the semiconductor contact layer. The metal migration semiconductor barrier layer is located entirely underneath the semiconductor contact layer, and the metal migration semiconductor barrier layer is in intimate contact with the semiconductor contact layer.

In still another aspect of the present invention, a semiconductor structure comprises a semiconductor substrate, a semiconductor active region formed on the semiconductor substrate, a semiconductor contact layer grown on top of the semiconductor active region, a metal migration semiconductor barrier layer, and a metal contact deposited on the metal migration semiconductor barrier layer. The metal migration semiconductor barrier layer is grown on top of the semiconductor contact layer, such that the metal migration semiconductor barrier layer is located entirely above the semiconductor contact layer. The metal migration semiconductor barrier layer is in intimate contact with the semiconductor contact layer.

In a further aspect of the present invention, a solar cell device structure comprises a semiconductor substrate, a first set of semiconductor active layers being based on gallium arsenide grown on top of the semiconductor substrate, a second set of semiconductor active layers being based on gallium indium phosphide grown on top of the first set of semiconductor active layers, a semiconductor contact layer grown on top of the second set of semiconductor active layers, a metal migration semiconductor barrier layer of aluminum indium phosphide embedded between the first region and the second region of the semiconductor contact layer, and a metal contact. The semiconductor substrate has a thickness of about 100 to 300 microns. The first set of semiconductor active layers has a thickness of about 2 to 4 microns. The second set of semiconductor active layers has a thickness of about 0.5 to 1.0 microns. The semiconductor contact layer includes a first region of gallium arsenide having a thickness of about 1000 to 5000 Å and a doping of about $1-5\times10^{18}$ cm$^{-3}$, a second region of gallium arsenide having a thickness of about 1000 to 5000 Å and a doping of $1-5\times10^{18}$ cm$^{-3}$, and a third region of gallium arsenide having a thickness of approximately 0 to 2000 Å and a doping of $1-5\times10^{19}$ cm$^{-3}$. The first region is grown on top of the second semiconductor active layer, the second region is grown on top of the first region, and the third region is grown above the second region. The metal migration semiconductor barrier layer is made of aluminum indium phosphide and has a thickness in the range of 250 Å to 500 Å. The metal contact is a titanium/gold/silver metallization deposited on the semiconductor contact layer. The metal contact includes a titanium layer having a thickness of about 25 to 100 Å and is deposited on the third region of the semiconductor contact layer, a gold layer having a thickness of about 300 to 600 Å, wherein the gold layer is deposited on the titanium layer, and a silver layer having a thickness of about 40,000 to 60,000 Å, wherein the silver layer is deposited on the gold layer.

In a still further aspect of the present invention, a cell-interconnect-coverglass assembly comprises a solar cell, a plurality of interconnects welded onto the metal contact, and a coverglass covering the solar cell and the interconnects. The solar cell includes semiconductor substrate, a semiconductor active region formed on the semiconductor substrate, a semiconductor contact layer grown on top of the semiconductor active region, a metal migration semiconductor barrier layer embedded within the semiconductor contact layer, and a metal contact deposited on top of the semiconductor contact layer.

In a still further aspect of the present invention, a contact structure comprises a semiconductor contact layer, and a metal migration semiconductor barrier layer, wherein the metal migration semiconductor barrier layer is in intimate contact with the semiconductor contact layer.

In still another aspect of the present invention, a method for forming a semiconductor structure with metal migration semiconductor barrier layers comprises the steps of: growing a semiconductor structure; blocking the metal migration from the metal contact towards the semiconductor active region with the metal migration semiconductor barrier layer; inhibiting metal/semiconductor reactions and formation of undesirable phases within the semiconductor active region. Growing the semiconductor structure includes the steps of: providing semiconductor substrate; forming a semiconductor active region on the semiconductor substrate; growing a semiconductor contact layer on top of the semiconductor active region; embedding a metal migration semiconductor barrier layer within the semiconductor contact layer; and depositing a metal contact on the semiconductor contact layer.

In still another aspect of the present invention, a method for forming a semiconductor structure with metal migration semiconductor barrier layers comprises the steps of: growing a semiconductor structure; blocking the metal migration from the metal contact towards the semiconductor active region with the metal migration semiconductor barrier layer; inhibiting metal/semiconductor reactions and formation of undesirable phases within the semiconductor active region. Growing the semiconductor structure includes the steps of: providing semiconductor substrate; forming a semiconductor active region on the semiconductor substrate; growing a metal migration semiconductor barrier layer on top of the semiconductor active region; growing a semiconductor contact layer on top of the metal migration semiconductor barrier layer; and depositing a metal contact on the metal migration semiconductor barrier layer.

In still another aspect of the present invention, a method for forming a semiconductor structure with metal migration semiconductor barrier layers comprises the steps of: growing a semiconductor structure; blocking the metal migration from the metal contact towards the semiconductor active region with the metal migration semiconductor barrier layer; inhibiting metal/semiconductor reactions and formation of undesirable phases within the semiconductor active region. Growing the semiconductor structure includes the steps of: providing semiconductor substrate; forming a semiconductor active region on the semiconductor substrate; growing a semiconductor contact layer on top of the semiconductor active region; growing a metal migration semiconductor barrier layer on top of the semiconductor contact layer; and depositing a metal contact on the metal migration semiconductor barrier layer.

These and other features, aspects and advantages of the present invention will become better understood with reference to the following drawings, description and claims.

DETAILED DESCRIPTION OF THE INVENTION

Figure 1:
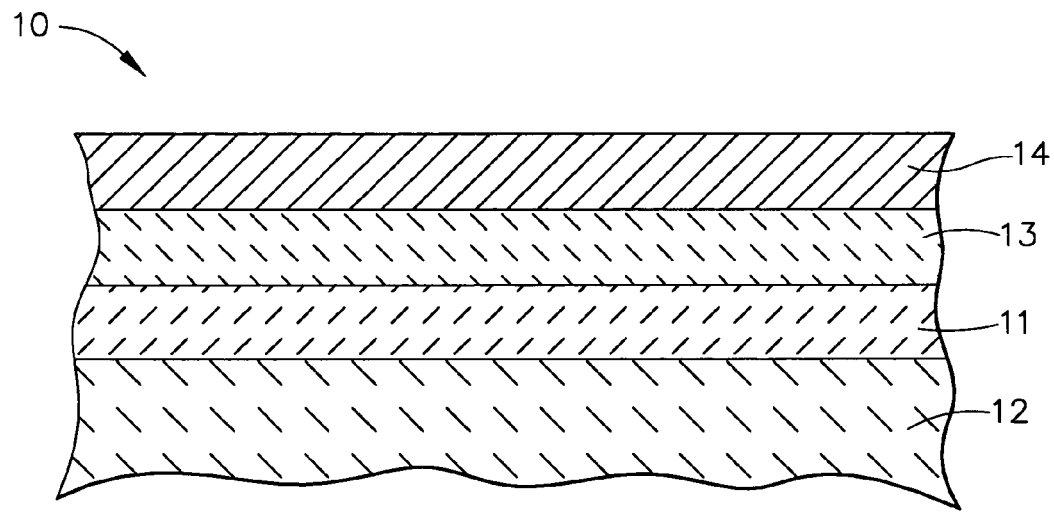
FIG. 1 is a schematic cross sectional view of a typical prior art semiconductor structure.
Figure 2:
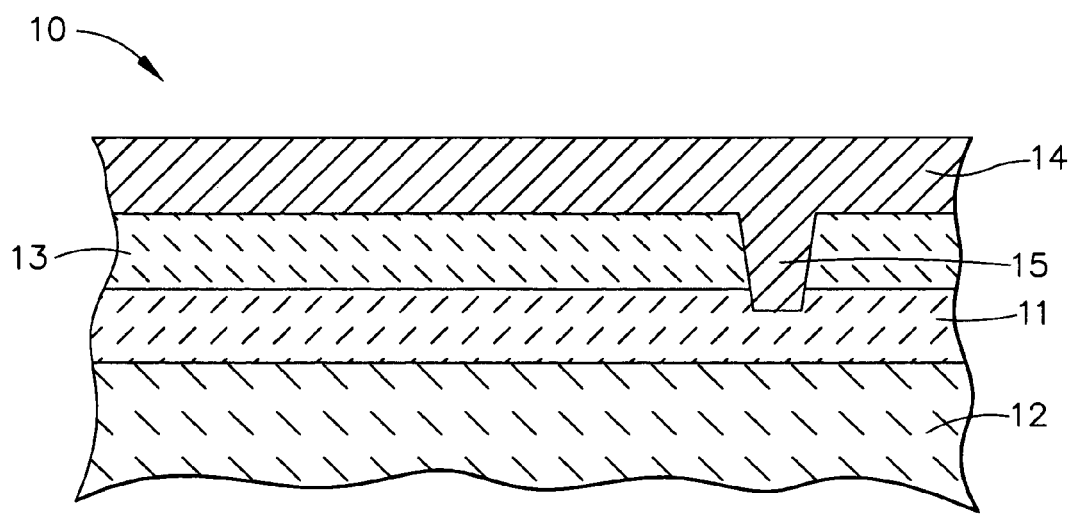
FIG. 2 is a schematic cross sectional view of a typical prior art semiconductor structure with metal protrusion.

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, an embodiment of the present invention provides a semiconductor structure with a contact structure for improved high temperature reliability. Contrary to the known prior art, the contact structure may include one or more metal migration semiconductor barrier layers embedded within or in intimate contact with a semiconductor contact layer that may be designed to block the movement of metal from the metal contact towards the semiconductor active region. The semiconductor structure as in one embodiment of the present invention may be used, for example, for III–V based multifunction solar cells that provide power to spacecraft, such as satellites. The semiconductor structure as in one embodiment of the present invention may further be used, for example, for III–V based terrestrial solar cells that typically operate under concentrated sunlight. Furthermore, an embodiment of the present invention provides a method for forming a semiconductor structure with metal migration semiconductor barrier layers for improving the high temperature reliability and the lifetime of the semiconductor structure compared to known prior art semiconductor structures.

In one embodiment, the present invention provides a semiconductor structure that has one or more metal migration semiconductor barrier layers incorporated within or outside of, but in intimate contact with, a semiconductor contact layer that prevent metal protrusion from the metal contact into the active region of the semiconductor structure during exposure of the semiconductor structure to high temperatures for long periods of time. By incorporating such metal migration semiconductor barrier layers into the contact structure of the semiconductor structure the performance, stability, and reliability of the semiconductor structure at high temperatures may be improved in comparison to prior art semiconductor structures that use a metal barrier layer.

An embodiment of the present invention further provides semiconductor materials, such as AlInP, that can be incorporated into the contact structure of a semiconductor device, for example, a multijunction III–V based solar cell, to prevent metal migration from the metal contact into the semiconductor active layers under extreme environmental conditions, such as exposure to high temperatures for extended amounts of time. The use of semiconductor materials, such as AlInP, as metal migration barrier materials instead of prior art metals with high temperature stability, such as Pt and Pd, enables the prevention of metal protrusion from the metal contact into the active region of the semiconductor structure even during long-term exposure to high temperatures, such as found in space applications. Therefore, contrary to prior art semiconductor structures, the semiconductor structures according to one embodiment of the present invention will exhibit enhanced performance during long-term exposure to high temperatures.

An embodiment of the present invention further provides at least one metal migration semiconductor barrier layer that is incorporated within the semiconductor contact layer of a semiconductor structure. In contrast of the known prior art, the metal migration semiconductor barrier layer as in one embodiment of the present invention is designed to block any movement of metal that might occur within the semiconductor contact layer and, therefore, to prevent any metal from entering the semiconductor active layers, which would cause the failure of the semiconductor structure. Contrary to prior art metal barrier layers, the metal migration semiconductor barrier layer according to one embodiment of the present invention is proven to work under long-term high temperature conditions, as found in space applications. By incorporating metal migration semiconductor barrier layers, as in one embodiment of the present invention, into the contact structure of a semiconductor structure, a contact structure with improved high temperature reliability, as needed, for example, in space applications may be designed.

By providing a contact structure according to one embodiment of the present invention, the high temperature reliability of a semiconductor device, such as a III–V based multifunction solar cell, can be improved in contrast to prior art semiconductor devices. Furthermore, the operation life of the semiconductor device under long-term high temperature conditions will be prolonged, which provides an advantage over prior art.

Figure 4:
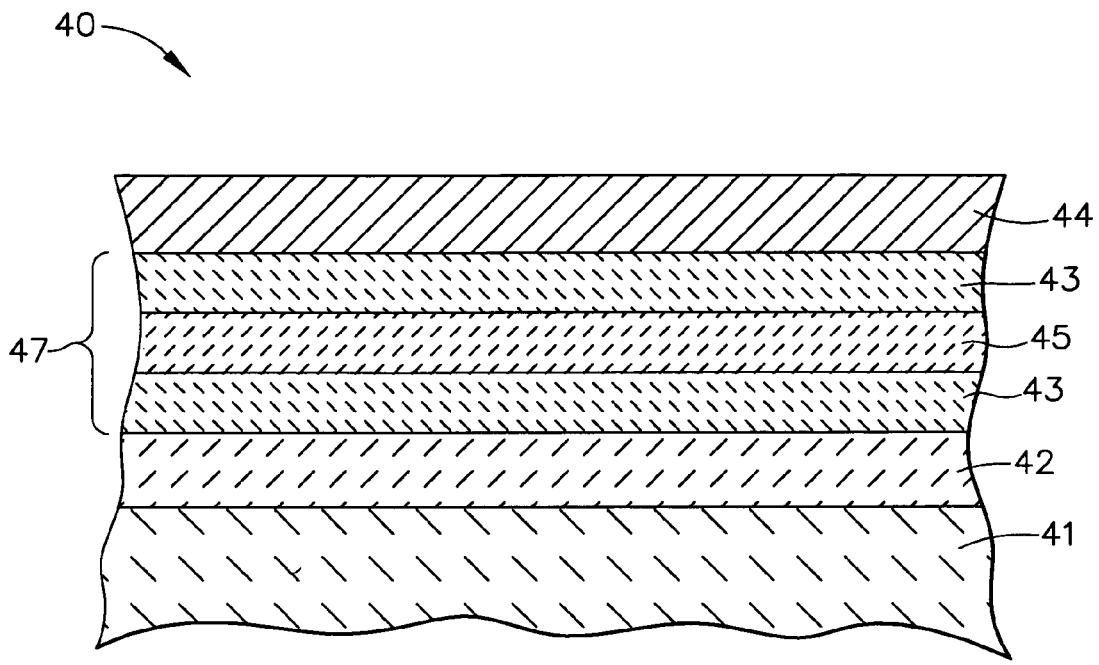
FIG. 4 is a schematic cross sectional view of a semiconductor structure according to one embodiment of the present invention.
Figure 8:
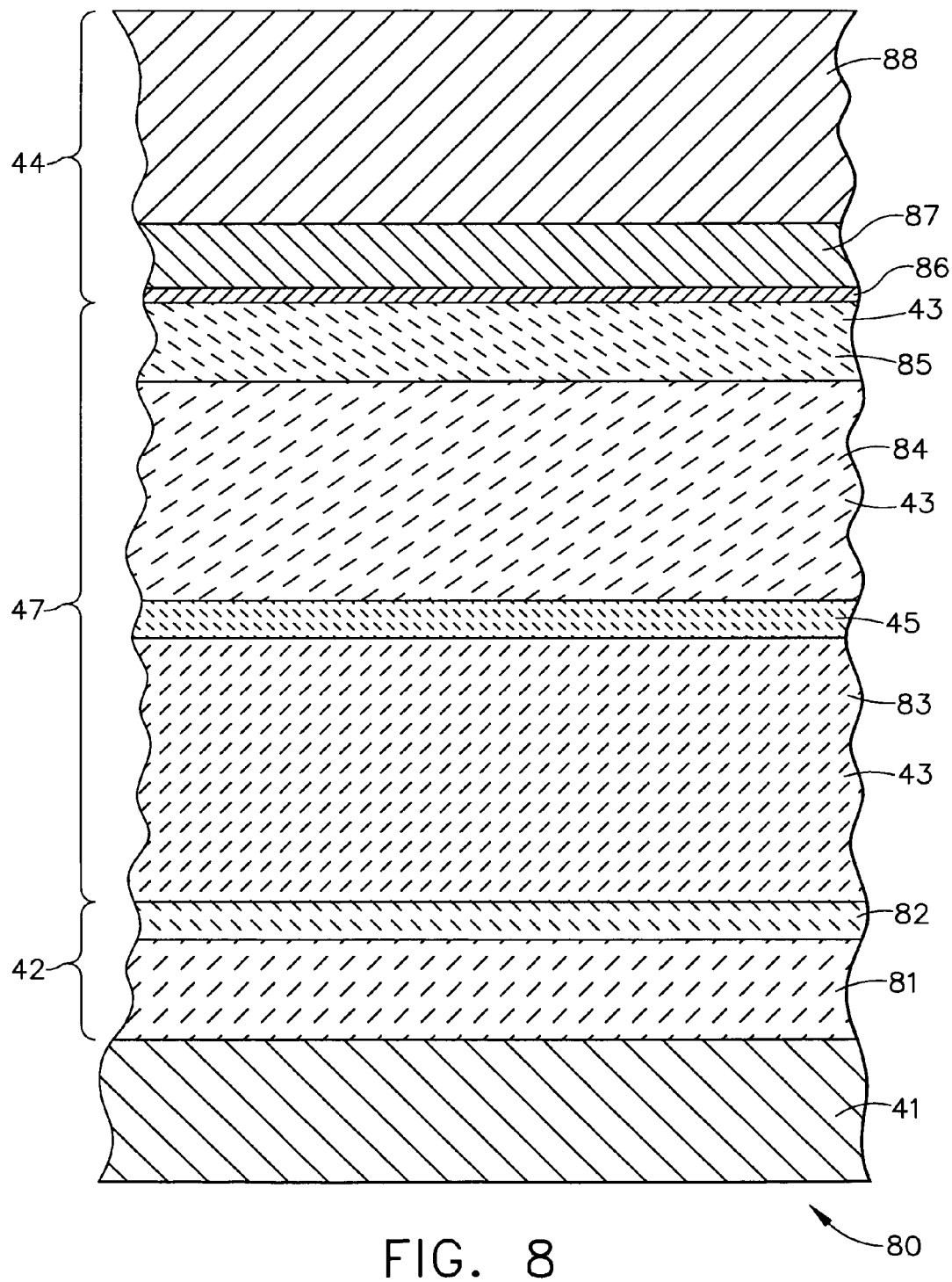
FIG. 8 is a schematic cross sectional view of a solar cell device structure according to another embodiment of the present invention.

Referring now to FIG. 4, a schematic cross sectional view of a semiconductor structure 40 is illustrated according to one embodiment of the present invention. The semiconductor structure 40 includes a semiconductor substrate 41, a semiconductor active region 42, a semiconductor contact layer 43, a metal contact 44, and at least one metal migration semiconductor barrier layer 45. The semiconductor active region 42 may include multiple semiconductor active layers such as 81 and 82 (as shown in FIG. 8). The semiconductor active layers may be deposited on the semiconductor substrate 41. The semiconductor contact layer 43 may then be grown on top of the semiconductor active region 42. The metal contact 44 may then be deposited on the semiconductor contact layer 43 in a separate process.

The semiconductor contact layer 43 is generally considered to be an inactive part of the semiconductor structure 40, since the inherent performance of the semiconductor structure 40 is not affected by the semiconductor contact layer 43. However, the semiconductor contact layer 43 is an important part of the semiconductor structure 40, since it is designed to be in intimate physical contact with the metal contact 44 and must provide sufficiently low contact resistance in order to minimize the impact on the overall semiconductor structure 40 performance. The present invention involves modifying the semiconductor contact layer 43. The semiconductor contact layer 43 and at least one metal migration semiconductor barrier layer 45 may form a contact structure 47. As shown in FIG. 4, at least one metal migration semiconductor barrier layer 45 may be embedded within the semiconductor contact layer 43 according to one embodiment of the present invention. FIG. 4 illustrates the metal migration semiconductor barrier layer 45 incorporated approximately in the middle of the semiconductor contact layer 44. However, the metal migration semiconductor barrier layer 45 may be placed anywhere within the semiconductor contact layer 43. Furthermore, more than one metal migration semiconductor barrier layer 45 may be embedded within the semiconductor contact layer 43. The location of the metal migration semiconductor barrier layer 45 within the semiconductor contact layer 43 as well as the number of metal migration semiconductor barrier layers 45 may influence the effectiveness of the contact structure 47.

Figure 5:
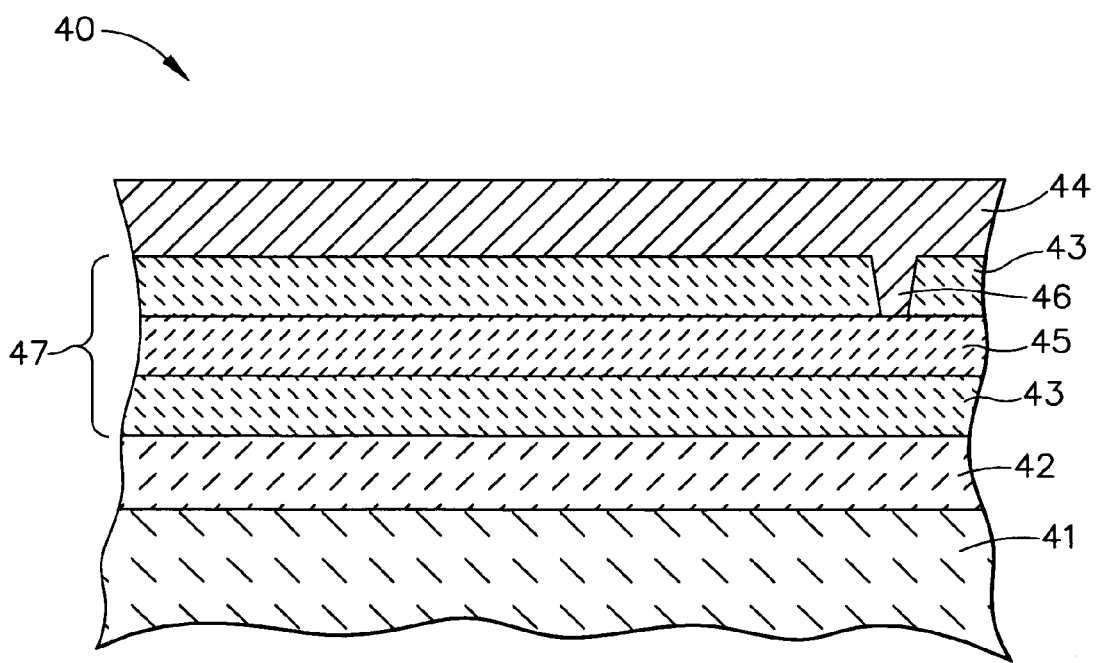
FIG. 5 is a schematic cross sectional view of a semiconductor structure with metal protrusion according to one embodiment of the present invention.

Referring now to FIG. 5, a schematic cross sectional view of a semiconductor structure 40 with metal protrusion 46 is illustrated according to one embodiment of the present invention. The semiconductor structure 40 has been exposed to high temperatures for a long time, similar to conditions found during applications in space. The prolonged exposure to high temperatures may cause a portion of the metal contact 44 to diffuse or migrate downward towards the semiconductor active region 42. Any metal reaching the active region 42 comprises a highly undesirable situation, as the metal atoms will likely short out the semiconductor P/N junction and may cause the structure 40 to fail. The metal migration semiconductor barrier layer 45 may function as a barrier to stop metal migration from the metal contact 44 and may prevent the metal protrusion 46 to extend into the semiconductor active region 42, as shown in FIG. 5.

Figure 6:
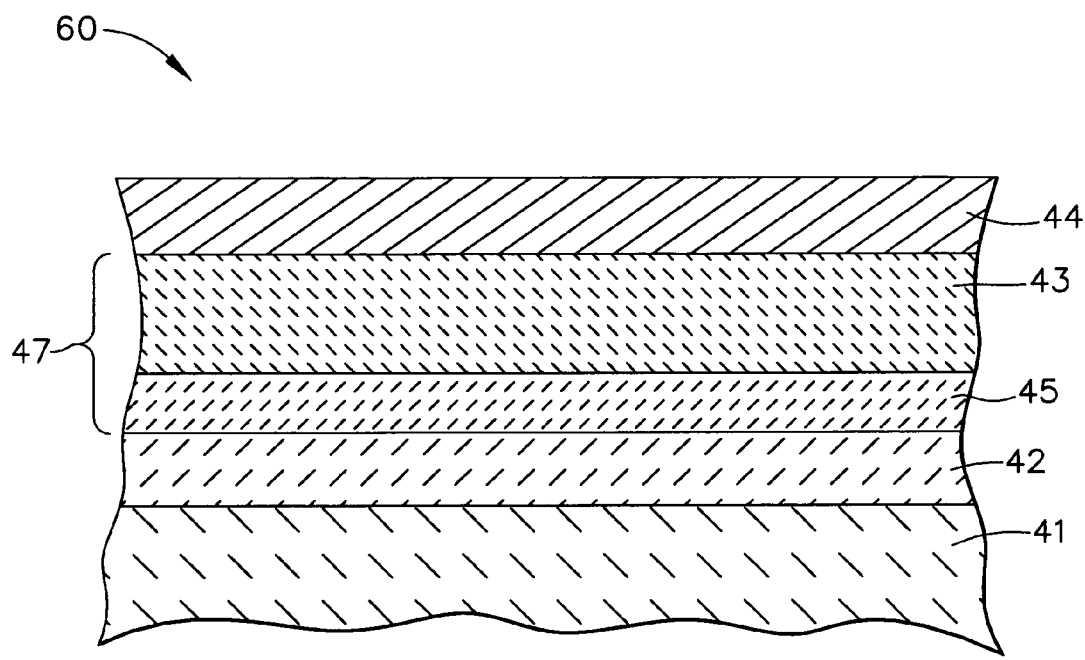
FIG. 6 is a schematic cross sectional view of a semiconductor structure according to another embodiment of the present invention.

Referring now to FIG. 6, a schematic cross sectional view of a semiconductor structure 60 is illustrated according to another embodiment of the present invention. The semiconductor structure 60 may include a semiconductor substrate 41, a semiconductor active region 42, a semiconductor contact layer 43, a metal contact 44, and a metal migration semiconductor barrier layer 45. The metal migration semiconductor barrier layer 45 may be grown on top of the semiconductor active region 42 followed by the semiconductor contact layer 43, such that the metal migration semiconductor barrier layer 45 may be located entirely underneath and in intimate contact with the semiconductor contact layer 43. The semiconductor contact layer 43 and the metal migration semiconductor barrier layer 45 may form a contact structure 47.

Figure 7:
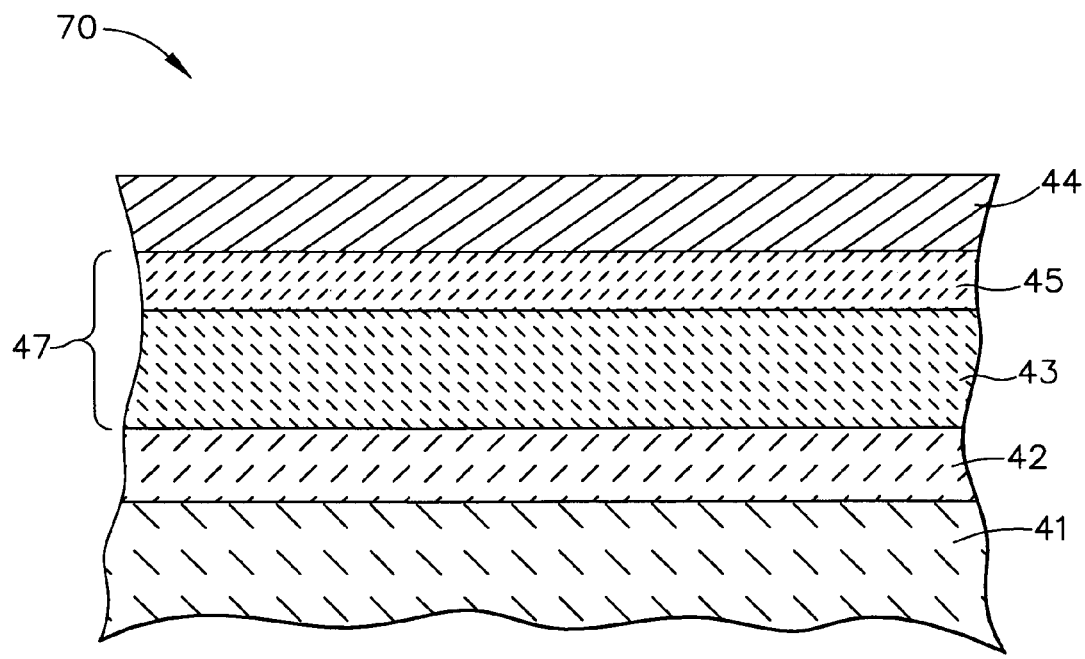
FIG. 7 is a schematic cross sectional view of a semiconductor structure according to another embodiment of the present invention.

Referring now to FIG. 7, a schematic cross sectional view of a semiconductor structure 70 is illustrated according to another embodiment of the present invention. The semiconductor structure 70 may include a semiconductor substrate 41, a semiconductor active region 42, a semiconductor contact layer 43, a metal contact 44, and a metal migration semiconductor barrier layer 45. The semiconductor contact layer 43 may be grown on top of the semiconductor active region 42. The metal migration semiconductor barrier layer 45 may be grown on top of the semiconductor contact layer 43, such that the metal migration semiconductor barrier layer 45 may be located entirely above and in intimate contact with the semiconductor contact layer 43. The semiconductor contact layer 43 and the metal migration semiconductor barrier layer 45 may form a contact structure 47.

Independent from the location of the metal migration semiconductor barrier layer 45 proximate to the semiconductor contact layer 43 and independent from the number of metal migration semiconductor barrier layers 45 embedded within the semiconductor compact layer 43, the combination of the semiconductor contact layer 43 and the metal migration semiconductor barrier layer 45 may provide a contact structure 47 that may improve the reliability of a semiconductor structure 40, 60, or 70 during exposure to high temperatures for prolonged time periods.

The semiconductor structure 40 (as illustrated in FIGS. 4 and 5), the semiconductor structure 60 (as illustrated in FIG. 6), and the semiconductor structure 70 (as illustrated in FIG. 7), all may be grown using a growth method known as metal organic vapor phase epitaxy (MOVPE). The use of other growth methods may also be possible. The effectiveness of the metal migration semiconductor barrier layer 45 has been demonstrated on III–V based multijunction solar cells. The use of the metal migration semiconductor barrier layer 45 as in FIGS. 4, 5, 6, and 7 is not limited to III–V based multijunction solar cells. The metal migration semiconductor barrier layer 45 may be incorporated into the contact structure of any semiconductor structure that is used for applications under prolonged high temperature conditions.

The preferred material for the metal migration semiconductor barrier layer 45 (as shown in FIGS. 4, 5, 6, and 7) may be aluminum indium phosphide, but the material for the metal migration semiconductor barrier layer may be extended to other phosphide compounds, such as gallium indium phosphide, and aluminum containing compounds, such as aluminum gallium arsenide.

Referring now to FIG. 8, a schematic cross sectional view of a solar cell device structure 80 is illustrated according to another embodiment of the present invention. The solar cell device structure 80 may include a semiconductor substrate 41, a semiconductor active region 42, a semiconductor contact layer 43, a metal contact 44, and a metal migration semiconductor barrier layer 45. The metal migration semiconductor barrier layer 45 may be embedded within the semiconductor contact layer 43 forming a contact structure 47. The semiconductor substrate 41 may be an elemental semiconductor such as silicon or germanium, or a III–V compound semiconductor such as gallium arsenide or indium phosphide. The semiconductor substrate 41 may have a thickness of about 100–300 microns. The semiconductor active region 42 may include a first set of semiconductor active layers 81 being based on gallium arsenide and a second set of semiconductor active layers 82 being based on gallium indium phosphide. The first set of semiconductor active layers 81 may have a thickness of about 2–4 microns and may be grown on top of the semiconductor substrate 41. The second set of semiconductor active layers 82 may have a thickness of about 0.5–1.0 microns and may be grown on top of the first set of semiconductor active layers 81. The semiconductor contact layer 43 grown on top of the second set of semiconductor active layers 82 may include a first region 83 of gallium arsenide having a thickness of approximately 1000–5000 Å and a doping of $1-5 \times 10^{18}$ cm$^{-3}$, a second region 84 of gallium arsenide having a thickness of approximately 1000–5000 Å and a doping of $1-5 \times 10^{18}$ cm$^{-3}$, and a third region 85 of gallium arsenide having a thickness of approximately 0–2000 Å and a doping of $1-5 \times 10^{19}$ cm$^{-3}$. The semiconductor contact layer 43 may also be grown from gallium indium arsenide with 1–3% indium. The metal migration semiconductor barrier layer 45 of aluminum indium phosphide with a thickness in the range of 250 to 500 Å may be embedded between the first region 83 and the second region 84 of the semiconductor contact layer 43. Other materials, such as aluminum gallium arsenide, gallium indium phosphide, gallium indium arsenide with higher indium contents, strain-balanced superlattices, strained layers, or other lattice-matched materials may be used as materials for the metal migration semiconductor barrier layer 45. The metal contact 44 may be a conventional titanium/gold/silver metallization and may include a 25–100 Å thick titanium layer 86, followed by a 300–600 Å thick gold layer 87, and a 40,000–60,000 Å thick silver layer 88. Other materials, for example, titanium/platinum/silver or modifications of the conventional titanium/gold/silver metallization may be used as material for the metal contact 44.

The semiconductor contact layer 43 may have the metal migration semiconductor barrier layer 45 embedded in it, as shown in FIG. 8, such that the metal migration semiconductor barrier layer 45 acts as a barrier against the diffusion of metal species, such as gold (87) or silver (88), from the metal contact 44 towards the active region 42. The metal migration semiconductor barrier layer 45 may further inhibit metal/semiconductor reactions and the formation of undesirable phases that can take place during a long-term exposure to high temperatures.

A method for forming a semiconductor structure 40 with metal migration semiconductor barrier layers 45 and therefore, for improving the high temperature reliability and the performance time at high temperatures of the semiconductor may include the steps of: growing a semiconductor structure 40 by depositing a semiconductor active region 42 on a semiconductor substrate 41; growing a semiconductor contact layer 43 on top of the semiconductor active region 42; embedding a metal migration semiconductor barrier layer 45 within the semiconductor contact layer 43; depositing a metal contact 44 on top of the semiconductor contact layer 43; blocking the metal migration from the metal contact 44 towards the semiconductor active region 42; inhibiting metal/semiconductor reactions and formation of undesirable phases; improving the high temperature reliability of the semiconductor structure 40; and extending the operation life of the semiconductor structure 40. More than one metal migration semiconductor barrier layers 45 may be embedded into the semiconductor contact layer 43. Furthermore, instead of being embedded into the semiconductor contact layer 43, the metal migration semiconductor barrier layer 45 may be deposited underneath and in intimate contact with the semiconductor contact layer 43 or above and in intimate contact with the semiconductor contact layer 43.

Figure 3:
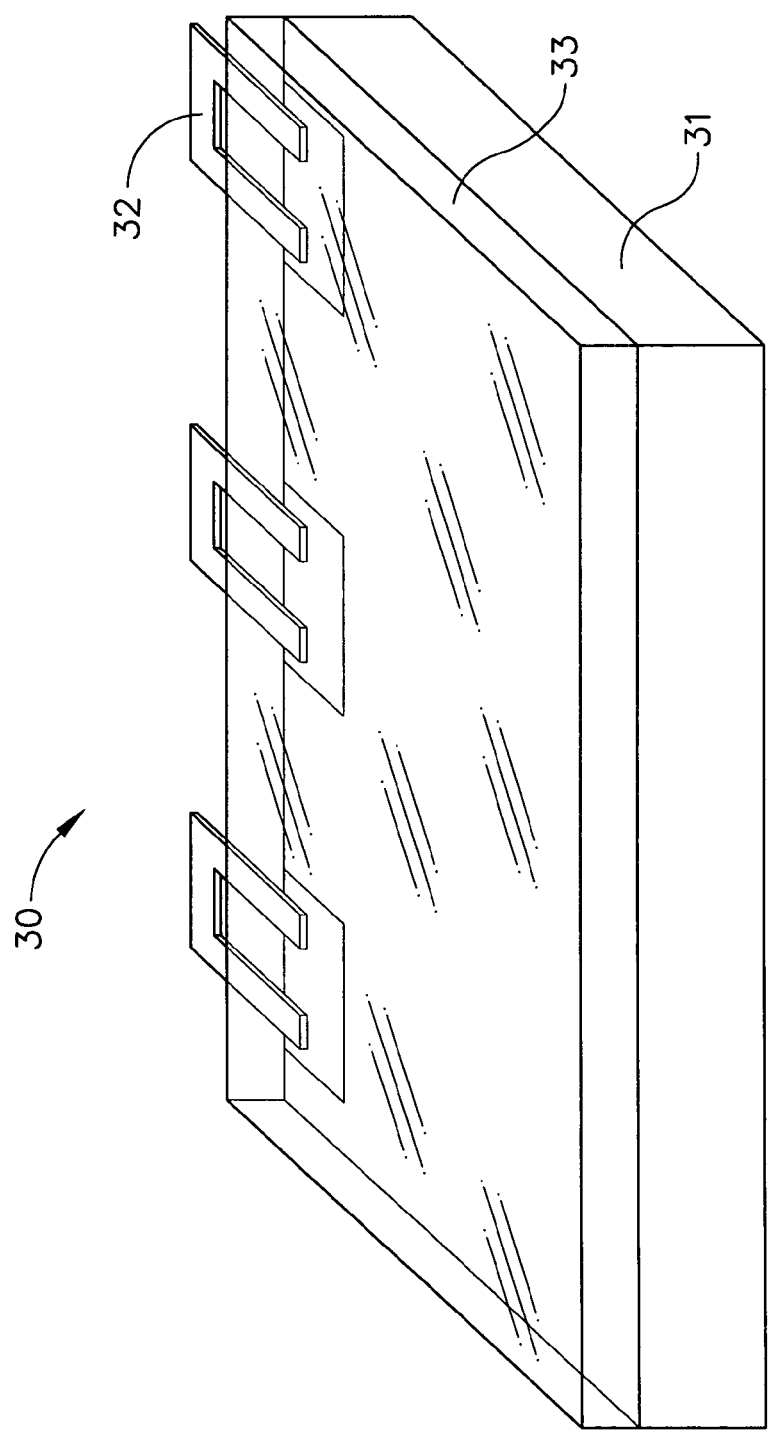
FIG. 3 is a perspective view of a cell-interconnect-coverglass assembly of a typical prior art multifunction solar cell.

Therefore, by providing a contact structure 47 that includes the semiconductor contact layer 43 and the metal migration semiconductor barrier layer 45 the reliability of a semiconductor structure 40, 60, 70, or 80 during long-term exposure to high temperatures may be improved and the operation time of the semiconductor structure 40, 60, 70, or 80 may be extended. Moreover, by using a solar cell 80 as in one embodiment of the present invention, for example, in a cell-interconnect-coverglass assembly 30 (as shown in FIG. 3), the high temperature reliability of this assembly 30 may be improved and the operation time may be prolonged, extending the life of the satellite that the solar cell 80 is powering. Although the contact structure 47 of the present invention may be used most effectively in III–V based multifunction solar cells that provide power to spacecraft, for example, satellites, other applications, for example, terrestrial solar cells, are possible.

It should be understood, of course, that the foregoing relates to preferred embodiments of the invention and that modifications may be made without departing from the spirit and scope of the invention as set forth in the following claims.

We claim:

1. A semiconductor structure, comprising:
a semiconductor substrate;
a semiconductor active region formed on said semiconductor substrate;
a semiconductor contact layer grown on top of said semiconductor active region;
a metal migration semiconductor barrier layer; wherein said metal migration semiconductor barrier layer is embedded within said semiconductor contact layer; and
a metal contact deposited on said semiconductor contact layer.

2. The semiconductor structure of claim 1, further comprising at least one additional metal migration semiconductor barrier layer, wherein said at least one additional metal migration semiconductor barrier layer is embedded within said semiconductor contact layer.

3. The semiconductor structure of claim 1, wherein said metal migration semiconductor barrier layer is embedded within said semiconductor contact layer proximate to the center of said semiconductor contact layer.

4. The semiconductor structure of claim 1, wherein said metal migration semiconductor barrier layer is made of aluminum indium phosphide.

5. A semiconductor structure, comprising:
a semiconductor substrate;

a semiconductor active region formed on said semiconductor substrate;
a metal migration semiconductor barrier layer grown on top of said semiconductor active region;
a semiconductor contact layer grown on top of said metal migration semiconductor barrier layer, such that said metal migration semiconductor barrier layer is located entirely underneath said semiconductor contact layer, and wherein said metal migration semiconductor barrier layer is in intimate contact with said semiconductor contact layer; and
a metal contact deposited on said semiconductor contact layer.

6. The semiconductor structure of claim 5, wherein the material of said metal migration semiconductor barrier layer is a phosphide compound.

7. The semiconductor structure of claim 5, wherein said semiconductor active region includes a first set of semiconductor active layers being based on gallium arsenide and a second set of semiconductor active layers being based on gallium indium phosphide.

8. The semiconductor structure of claim 7, wherein said first set of semiconductor active layers is grown on top of said semiconductor substrate and wherein said second set of semiconductor active layers is grown on top of said first set of semiconductor active layers.

9. A semiconductor structure, comprising:
a semiconductor substrate;
a semiconductor active region formed on said semiconductor substrate;
a semiconductor contact layer grown on top of said semiconductor active region;
a metal migration semiconductor barrier layer; wherein said metal migration semiconductor barrier layer is grown on top of said semiconductor contact layer, such that said metal migration semiconductor barrier layer is located entirely above said semiconductor contact layer, and wherein said metal migration semiconductor barrier layer is in intimate contact with said semiconductor contact layer; and
a metal contact deposited on said metal migration semiconductor barrier layer.

10. The semiconductor structure of claim 9, wherein the material of said metal migration semiconductor barrier layer is an aluminum-containing compound.

11. The semiconductor structure of claim 9, wherein said metal contact is a titanium/gold/silver metallization.

12. The semiconductor structure of claim 9, wherein the material of said semiconductor contact layer is gallium arsenide.

13. A solar cell device structure, comprising:
a semiconductor substrate, wherein said semiconductor substrate has a thickness of about 100 to 300 microns;
a first set of semiconductor active layers being based on gallium arsenide, wherein said first set of semiconductor active layers has a thickness of about 2 to 4 microns, and wherein said first set of semiconductor active layers is grown on top of said semiconductor substrate;
a second set of semiconductor active layers being based on gallium indium phosphide, wherein said second set of semiconductor active layers has a thickness of about 0.5 to 1.0 microns, and wherein said second set of semiconductor active layers is grown on top of said first set of semiconductor active layers;
a semiconductor contact layer grown on top of said second set of semiconductor active layers, including:
a first region of gallium arsenide having a thickness of about 1000 to 5000 Å and a doping of $1-5\times10^{18}$ $cm^3$;
a second region of gallium arsenide having a thickness of about 1000 to 5000 Å and a doping of $1-5\times10^{18}$ $cm^3$; and
a third region of gallium arsenide having a thickness of approximately 0 to 2000 Å and a doping of $1-5\times10^{19}$ $cm^3$; wherein said first region is grown on top of said second semiconductor active layer, wherein said second region is grown on top of said first region, and wherein said third region is grown above said second region;
a metal migration semiconductor barrier layer of aluminum indium phosphide having a thickness in the range of 250 Å to 500 Å, and wherein said metal migration semiconductor barrier layer is embedded between said first region and said second region of said semiconductor contact layer;
a metal contact, wherein said metal contact is a titanium/gold/silver metallization deposited on said semiconductor contact layer, and wherein said metal contact includes:
a titanium layer having a thickness of about 25 to 100 Å, wherein said titanium layer is deposited on said third region of said semiconductor contact layer;
a gold layer having a thickness of about 300 to 600 Å, wherein said gold layer is deposited on said titanium layer; and
a silver layer having a thickness of about 40,000 to 60,000 Å, wherein said silver layer is deposited on said gold layer.

14. The solar cell device structure of claim 13, wherein said semiconductor substrate is an elemental semiconductor.

15. The solar cell device structure of claim 13, wherein said semiconductor substrate is a III–V compound semiconductor.

16. The solar cell device structure of claim 13, wherein the material of said metal migration semiconductor barrier layer is selected from the group consisting of aluminum gallium arsenide, gallium indium phosphide, gallium indium arsenide, strain-balanced superlattices, strained layers, and lattice-matched materials.

17. The solar cell device structure of claim 13, wherein said metal contact is a titanium/platinum/silver metallization.

18. A cell-interconnect-coverglass assembly, comprising:
a solar cell, including:
a semiconductor substrate;
a semiconductor active region formed on said semiconductor substrate;
a semiconductor contact layer grown on top of said semiconductor active region;
a metal migration semiconductor barrier layer embedded within said semiconductor contact layer; and
a metal contact deposited on top of said semiconductor contact layer;
a plurality of interconnects welded onto said metal contact; and
a coverglass covering said solar cell and said interconnects.

19. The cell-interconnect-coverglass assembly of claim 18, wherein said semiconductor substrate is selected from the group consisting of elemental semiconductors and III–V compound semiconductors.

20. The cell-interconnect-coverglass assembly of claim 18, wherein said solar cell provides power to a spacecraft.

21. The cell-interconnect-coverglass assembly of claim 18, wherein said solar cell provides power to a satellite.

22. A contact structure, comprising:
a semiconductor contact layer; and
a metal migration semiconductor barrier layer, wherein said metal migration semiconductor barrier layer is embedded within said semiconductor contact layer.

23. The contact structure of claim 22, further comprising an additional metal migration semiconductor barrier layer embedded within said semiconductor contact layer.

24. The contact structure of claim 22, wherein said semiconductor contact layer and said metal migration semiconductor barrier layer are part of a semiconductor device.

25. The contact structure of claim 22, wherein said semiconductor contact layer and said metal migration semiconductor barrier layer are part of a III–V based multifunction solar cell.

26. The contact structure of claim 22, wherein the material of said metal migration semiconductor barrier layer is aluminum indium phosphide.

* * * * *